(12) United States Patent
Taguwa (10) Patent No.: US 6,176,936 B1
(45) Date of Patent: Jan. 23, 2001

(54) IN-SITU CHAMBER CLEANING METHOD OF CVD APPARATUS

(75) Inventor: Tetsuya Taguwa, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/120,202

(22) Filed: Jul. 22, 1998

(30) Foreign Application Priority Data

Jul. 22, 1997 (JP) ........................................ 195617

(51) Int. Cl.$^7$ ........................................ B08B 9/00
(52) U.S. Cl. .......................... 134/2; 134/21; 134/22.1; 216/37; 438/905
(58) Field of Search ................ 134/1.1, 1.2, 1.3, 134/2, 21, 22.1; 216/37; 438/905

(56) References Cited

U.S. PATENT DOCUMENTS 5,926,737 * 7/1999 Ameen et al. ................. 438/649
5,954,887 * 7/1999 Hatano ........................... 134/2

FOREIGN PATENT DOCUMENTS 4210479  7/1992 (JP) .
11-16858 1/1999 (JP) .

* cited by examiner

*Primary Examiner*—Randy Gulakowski
*Assistant Examiner*—Allan Olsen
(74) *Attorney, Agent, or Firm*—Sughrue, Mion, Zinn, Macpeak & Seas, PLLC (57) ABSTRACT

A chamber cleaning method of a CVD apparatus is provided, which decreases the cleaning time and increases the throughput of a CVD process. A desired film of a metal or metal compound has been formed on a semiconductor substrate placed in a reaction chamber of the CVD apparatus through a reducing decomposition reaction of a source gas. The source gas is a metal halide gas containing a metal element of the desired film. An undesired film of a same metal or metal compound as the desired film has been formed on an inner exposed surface of the chamber in addition to the desired film formed on the substrate. First, (a) the semiconductor substrate on which the desired film has been formed is taken out of the reaction chamber of the CVD apparatus. Next, (b) a cleaning gas having an etching action and a diluting gas are introduced into the reaction chamber of the CVD apparatus after the step (a), thereby removing the undesired film from the inner exposed surface of the reaction chamber by the etching action of the cleaning gas. The cleaning gas is a metal halide gas containing the metal element of the desired film. An etch residue is generated in the reaction chamber by etching the undesired film. Finally, (c) the cleaning gas and the diluting gas introduced into the reaction chamber of the CVD apparatus are evacuated from the chamber together with the etch residue.

9 Claims, 9 Drawing Sheets

IN-SITU CHAMBER CLEANING METHOD OF CVD APPARATUS

BACKGROUND OF THE INVENTION

1. Field of the Invention

The present invention relates to cleaning of a Chemical vapor Deposition (CVD) apparatus and more particularly, to an in-situ cleaning method of a reaction chamber of a CVD apparatus in which an elementary metal or metal compound film is formed on a semiconductor substrate or wafer through a chemical reaction of reducing decomposition of a metal halide gas.

2. Description of the Prior Art

In recent years, miniaturization of contact holes has been progressing more and more with the increasing integration level of Large-Scale Integrated circuits (LSIs) and consequently, the aspect ratio of the contact holes has been becoming larger and larger. Here, the aspect ratio is defined as a ratio of the depth of a contact hole with respect to the diameter thereof.

Under such the circumstance as above, the conventional wiring or interconnection film, which is typically made of aluminum (Al) deposited by a sputtering process, tends to have various disadvantages. For example, the contact resistance of the wiring or interconnection film becomes high and the wiring or interconnection film itself becomes discontinuous at the windows of the contact holes, which are due to the low step-coverage property of the film. Also, the Al film tends to be discontinuous due to the electromigration phenomenon during operation, thereby lowering its reliability.

To avoid these disadvantages, various metal plugs have been developed to electrically interconnect an upper conductive layer to a lower conductive layer. In this case, the upper and lower conductive layers are electrically connected together through the metal plugs that fill the contact holes of an intervening dielectric film between the upper and lower conductive layers.

A typical example of the metal plugs is tungsten (W) plugs formed by a plasma-enhanced CVD process with a good step coverage.

In the case of the W plugs, first, a thin titanium (Ti) film is formed on a dielectric film with contact holes by a sputtering process, so that the Ti film is deposited not only on the surface of the dielectric film but also in the contact holes thereof. The thin Ti film serves to lower the contact resistance with a silicon substrate as the lower conductive layer.

Next, a titanium nitride (TiN) film is formed by a sputtering process on the entire Ti film thus deposited. The TiN film serves to improve the adhesion strength of a W film to the Ti film and to prevent the W atoms in the W film from entering the silicon substrate. The Ti and TiN films serves as a metal barrier.

Subsequently, a W film for forming the W plugs is formed on the entire TiN film by a CVD process.

Finally, the unnecessary W, TiN, and Ti films on the surface of the dielectric film are etched back, thereby leaving selectively the W, TiN, and Ti films in the contact holes thereof. Thus, the W plugs located on the TiN and Ti films are formed in the respective contact holes of the dielectric film.

However, if the aspect ratio of the contact holes is further increased, the sputtered Ti and TiN films for the W plugs will become unable to have satisfactorily large thicknesses in the contact holes. This leads to such problems as increase in contact resistance and damage of the electronic devices or elements on the substrate.

To prevent these problems from occurring, the Ti and TiN films may be formed by CVD processes. In this case, however, the following problem tends to occur.

Specifically, if each of the Ti and TiN films is formed by a CVD process, the Ti or TiN films tends to be deposited not only on the substrate but also on the exposed inner surfaces of a reaction chamber of a CVD apparatus. The undesired Ti or TiN film that has been deposited on the inner surfaces of the chamber will be detached therefrom at the time when the Ti or TiN film has grown to have a specific thickness. The detached Ti or TiN film will become a cause of particulate contamination generated in the chamber. This problem will be explained in detail below with reference to FIGS. 1A and 1B.

Figure 1A:
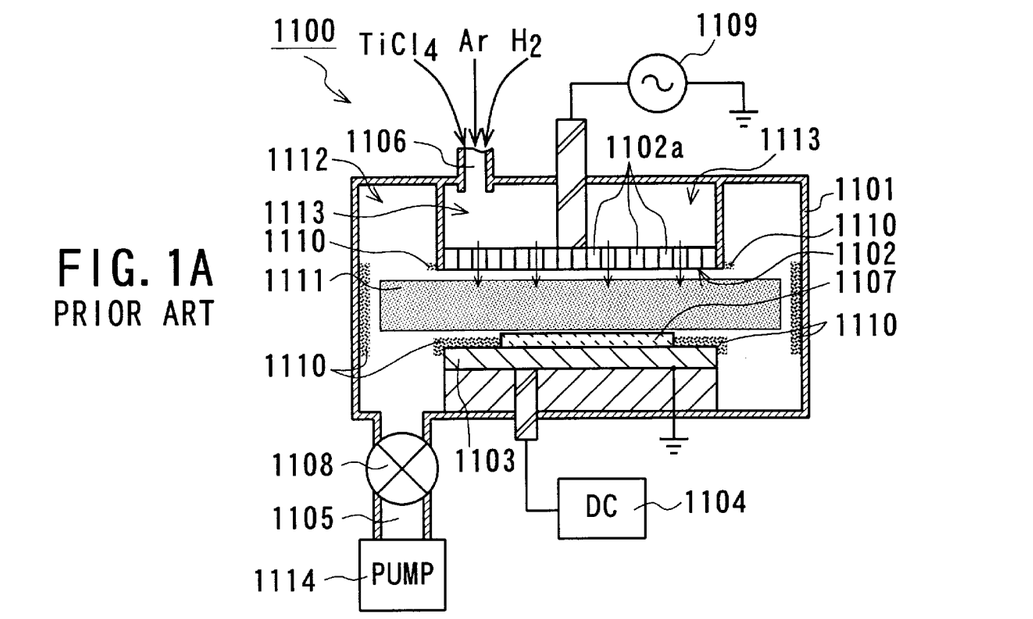
FIGS. 1A and 1B are schematic cross-sectional views of a plasma-enhanced CVD apparatus, respectively, in which a conventional chamber cleaning method is conducted after a plasma-enhanced CVD process for forming a metal or metal compound film on a semiconductor substrate.
Figure 1B:
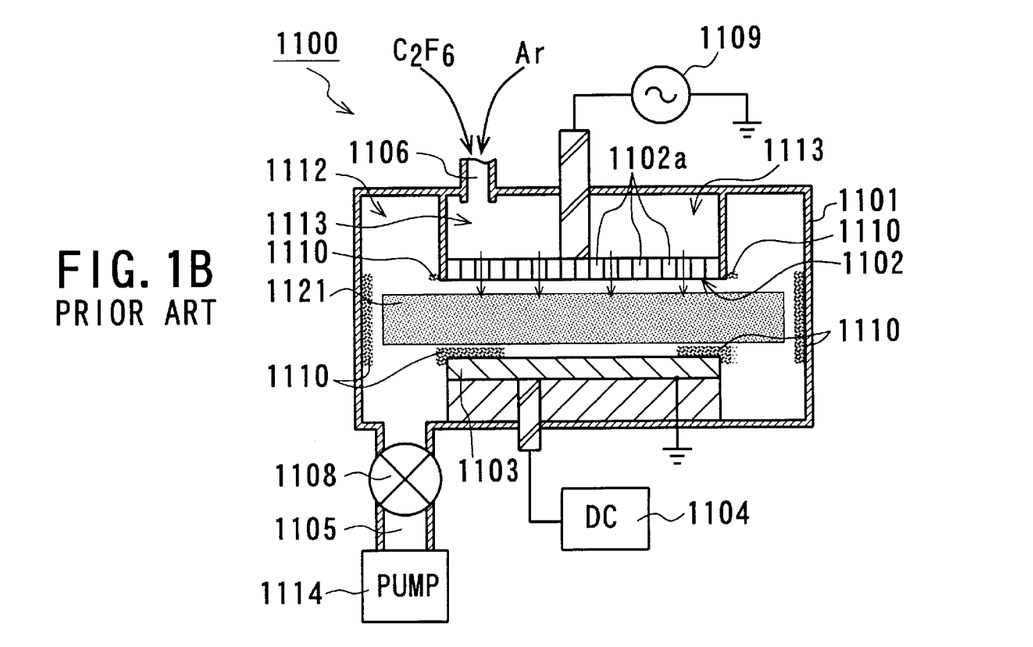

FIGS. 1A and 1B schematically show the typical configuration of a plasma-enhanced CVD apparatus.

A plasma-enhanced CVD apparatus 1100 shown in FIGS. 1A and 1B has a reaction chamber 1101, an upper electrode 1102 fixed onto the inner top wall of the chamber 1101, a susceptor or substrate holder 1103 fixed onto the inner bottom wall of the chamber 1101, a radio-frequency (RF) power supply 1109 provided outside the chamber 1101, a direct-current (DC) power supply 1104 provided outside the chamber 1101, and a vacuum pump system 1114 provided outside the chamber 1101.

The upper electrode 1102, which is electrically connected to the RF power supply 1109, has an inner space 1113 and emission holes 1102a. A specific RF power is supplied to the upper electrode 1102 on operation. The inner space 1113 communicates with gas sources (not shown) provided outside the chamber 1101 through a gas inlet 1106 of the reaction chamber 1101. The emission holes 1102a communicates with a reaction space 1112 of the chamber 1101. The supplied gasses to the inner space 1113 are mixed in the space 1113 and then, emitted through the emission holes 1102a to the reaction space 1112.

The inside of the reaction chamber 1101 (i.e. the reaction space 1112) communicates with the vacuum pump system 1114 through a gas outlet 1105 of the chamber 1101. A pressure-regulating valve 1108 is provided at the gas outlet 1105. The gas or gases existing in the reaction space 1112 is/are evacuated by the vacuum pump system 1114 to generate a vacuum atmosphere in the space 1112. The pressure in the space 1112 may be adjusted by the pressure-regulating valve 1108.

The susceptor 1103 is electrically connected to the DC power supply 1104. A specific DC voltage is applied to the susceptor 1103 and the substrate 1107 placed thereon on operation.

When a Ti film is formed on a silicon wafer or substrate 1107 on which a lot of semiconductor devices have been fabricated through the popular fabrication processes such as photolithography, dry etching, and film deposition, first, the silicon substrate 1107 is transported into the reaction chamber 1101 of the CVD apparatus 1100 and then, placed on the susceptor 1103. Prior to this step, a specific vacuum atmosphere has been generated in the reaction space 1112 of the chamber 1101.

Next, titanium tetrachloride ($TiCl_4$), argon (Ar), and hydrogen ($H_2$) gasses are supplied to the inner space 1113 of the upper electrode 1102 through the gas inlet 1106 of the reaction chamber 1101, and mixed therein. The mixture of $TiCl_4$, Ar, and $H_2$ gases thus produced is then emitted toward the substrate 1107 through the emission holes 1102a of the upper electrode 1102. Thus, the mixture of $TiCl_4$, Ar, and $H_2$ gasses are introduced into the reaction space 1102 of the chamber 1101.

On the other hand, a specific DC bias voltage is applied to the substrate 1107 by the DC power supply 1104 and at the same time, a specific RF power is supplied to the upper electrode 102 by the RF power supply 1109, thereby making a plasma 1111 of $TiCl_4$, Ar, and $H_2$ in the reaction space 1102 of the chamber 1101, as shown in FIG. 1A.

Thus, a Ti film (not shown) with a thickness of approximately 5 to 30 nm is formed on the silicon substrate 1107 by a plasma-enhanced CVD process.

During this CVD process, undesired Ti films 1110 tend to be deposited on several areas of the inner walls of the vacuum chamber 1101, the upper electrode 1102, and the susceptor 1103, as shown in FIG. 1A. The undesired Ti films 1110 thus deposited will grow every time when the above CVD process is carried out.

If the undesired Ti films 1110 grows to have a specific thickness after the above CVD process is repeated approximately a hundred times in the plasma CVD apparatus shown in FIG. 1A, at least a part of the undesired Ti films 1110 tend to be detached from the chamber 1101, the upper electrode 1102, or the susceptor 1103. The detached Ti films 1110 will generate some particulate contamination in the reaction space 1112 of the chamber 1101.

Moreover, even if the undesired Ti films 1110 are not detached, the atmosphere in the reaction space 1102 is badly affected by the undesired Ti films 1110. Thus, the growth rate and/or the quality of the Ti film on the substrate 1107 will degrade.

Especially, if the particulate contamination is contacted with the substrate 1107 during the above CVD process for the Ti film, the wiring or interconnection lines tend to be in short-circuit. This problem lowers the fabrication yield of the semiconductor devices to be fabricated on the substrate 1107. Accordingly, the undesired Ti films 1110 deposited in the reaction chamber 1101 need to be removed by a cleaning process each time when the above CVD-process is repeated specific times.

An example of the conventional cleaning methods of this sort is shown in FIG. 1B, in which the undesired Ti films 1110 are removed by using a plasma 1121 of hexafluoroethane ($C_2F_6$) and argon (Ar). The undesired Ti films 1110 are contacted with the plasma 1121 for approximately 30 minutes to be removed.

The plasma 1121 may be generated by using any other halide than $C_2F_6$.

In this conventional cleaning method, to remove unwanted residual products generated through this cleaning process, a plasma of Ar and $H_2$ is generated in the reaction chamber 1101 and is kept for approximately 10 minutes as a post-cleaning process. After this post-cleaning process is finished, an ordinary CVD process will be able to be restarted in this CVD apparatus 1100.

With the above-described conventional cleaning method, the reaction space 1112 of the chamber 1101 is sufficiently cleaned after the post-cleaning process. However, there is a problem that the cleaning gas such as $C_2F_6$ and undesired residual products that have been produced during the post-cleaning process tend to be left in the supplying and evacuating tubes and/or valves such as the inlet port 1106, the output port 1105, and the pressure-regulating valve 1108, which adversely affects the atmosphere in the chamber 1101.

To avoid such the bad effect, a dummy CVD process needs to be conducted five times or more to thereby remove completely the undesired cleaning gas and residual products.

As another example of the previously-described metal plugs, titanium nitride (TiN) plugs formed by a thermal CVD process have been studied instead of the above-described W plugs. This is because the thermal CVD process has a better step-coverage property than the plasma-enhanced CVD process.

Figure 2A:
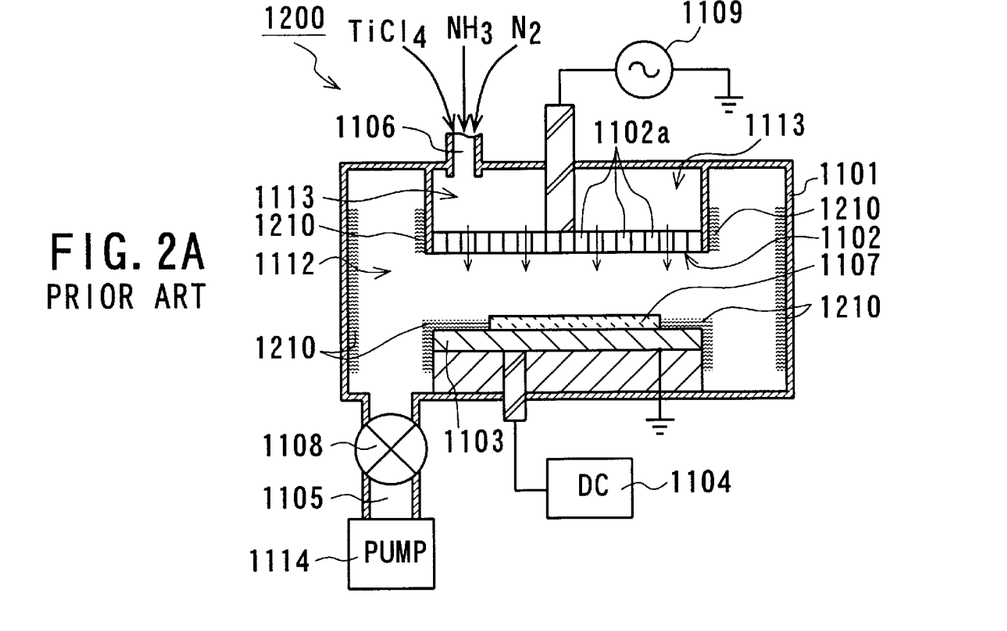
FIGS. 2A to 2C are schematic cross-sectional views of a thermal CVD apparatus, respectively, in which another conventional chamber cleaning method is conducted after a thermal CVD process for forming a metal or metal compound film on a semiconductor substrate.
Figure 2B:
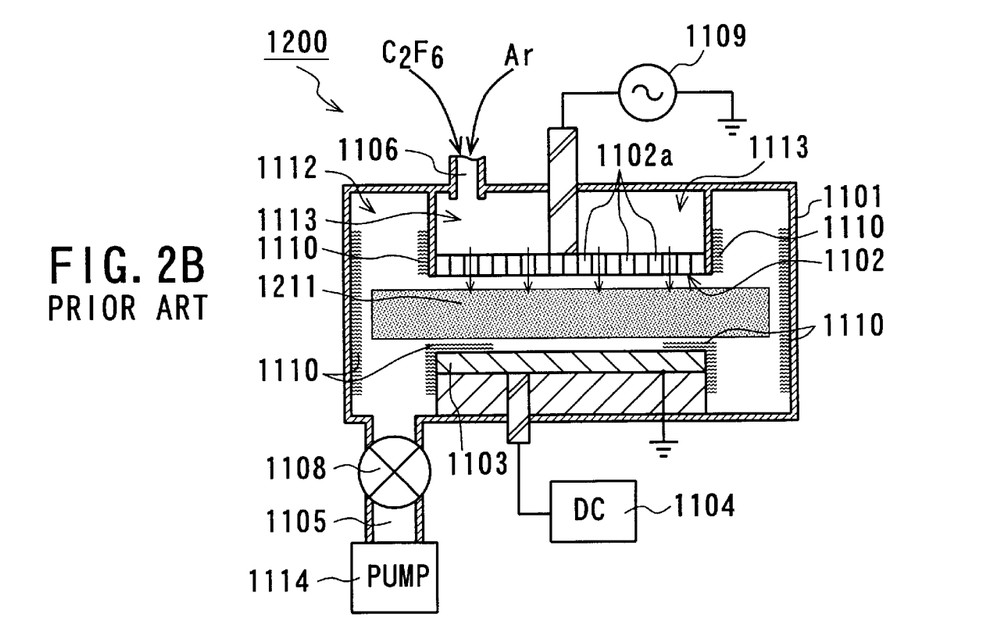

FIGS. 2A and 2B schematically show the typical configuration of a thermal CVD apparatus 1200 used for forming the TiN plugs. This apparatus 1200 has a same configuration as that of the plasma-enhanced CVD apparatus 1100 shown in FIG. 1A.

When a TiN film is formed on the silicon substrate 1107 on which a lot of semiconductor devices have been fabricated, first, the silicon substrate 1107 is transported into the reaction chamber 1101 of the CVD apparatus 1200 and then, placed on the susceptor 1103. Prior to this step, a specific vacuum atmosphere has been generated in the reaction space 1112 of the chamber 1101.

Next, titanium tetrachloride ($TiCl_4$), ammonia ($NH_3$), and hydrogen ($H_2$) gasses are supplied to the inner space 1113 of the upper electrode 1102 through the gas inlet 1106 of the reaction chamber 1101, and mixed therein. The mixture of $TiCl_4$, $NH_3$, and $H_2$ gases thus produced is then emitted toward the substrate 1107 through the emission holes 1102a of the upper electrode 1102. Thus, the mixture of $TiCl_4$, $NH_3$, and $H_2$ gases are introduced into the reaction space 1102 of the chamber 1101.

Since no plasma is used, no DC bias voltage is applied to the substrate 1107 and no specific RF power is supplied to the upper electrode 102, as shown in FIG. 2A.

Thus, a TiN film (not shown) is formed on the silicon substrate 1107 by a thermal CVD process.

During this CVD process, undesired TiN films 1210 tend to be deposited on several areas of the inner walls of the vacuum chamber 1101, the upper electrode 1102, and the susceptor 1103. as shown in FIG. 2A. The undesired TiN films 1210 thus deposited will grow every time when the above CVD process is carried out.

In the case of the TiN plugs, it is required that a TiN film is formed to have a large thickness of several thousands angstroms through a single CVD process. Therefore, the undesired TiN films 1210 tend to have a larger thickness than that of the Ti films 1110. Accordingly, the interval of the chamber cleaning becomes shorter than the case of the Ti film.

For example, if the above-described chamber cleaning method using the plasma 1121 of $C_2H_6$ and Ar is applied, as shown in FIG. 2B, this cleaning method needs to be conducted each time when the CVD process is repeated approximately 50 times which is less than approximately 100 times for the Ti films 1110.

Further, unlike the case of the Ti film, a thermal reaction is used for deposition of the TiN film. Therefore, the undesired TiN films 1210 tend to be deposited on the wider areas of the inner exposed surfaces of the reaction chamber 1101 than the case of the Ti film, as shown in FIG. 2B.

Figure 2C:
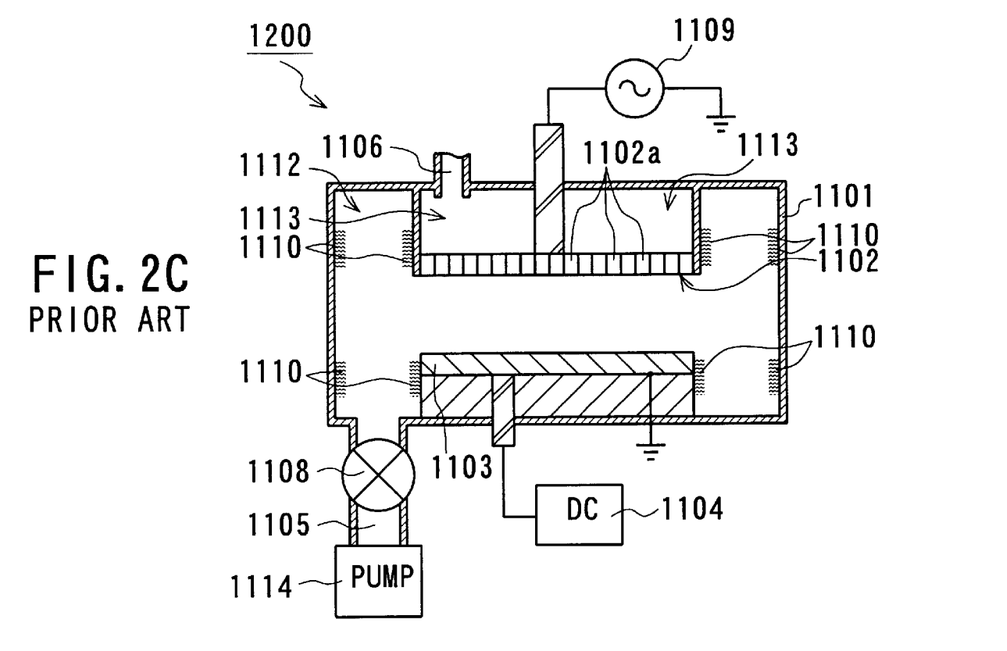

Thus, even if the above-identified chamber cleaning method shown in FIG. 2B is applied to the TiN films 1210, there is a problem that a part of the undesired TiN films 1210 tends to be left, as shown in FIG. 2C. This is because the plasma 1211 is locally generated at the area between the upper electrode 1102 and the susceptor 1103 and because the anisotropically etching action of the plasma 1211 is blinded by the upper electrode 1102 and the susceptor 1103.

There is another problem that the thermal CVD apparatus 1200 needs to be equipped with a very-expensive plasma generator for the purpose of chamber cleaning alone. This raises the fabrication cost of the thermal CVD apparatus 1200 and that of the semiconductor devices fabricated with the use of this apparatus 1200.

SUMMARY OF THE INVENTION

Accordingly, an object of the present invention is to provide a chamber cleaning method of a CVD apparatus that decreases the cleaning time and increases the throughput of a CVD process.

Another object of the present invention is to provide a chamber cleaning method of a CVD apparatus that cleans the inside of a reaction chamber of a CVD apparatus without using plasma.

Still another object of the present invention is to provide a chamber cleaning method of a CVD apparatus in which the quality of the desired film formed on the semiconductor substrate is stable independent of the number of the performed CVD processes.

A further object of the present invention is to provide a chamber cleaning method of a CVD apparatus that decreases the fabrication cost of a CVD apparatus.

A still further object of the present invention is to provide a chamber cleaning method of a CVD apparatus that necessitates no dummy CVD process after cleaning.

The above objects together with others not specifically mentioned will become clear to those skilled in the art from the following description.

A chamber cleaning method of a CVD apparatus according to the present invention is comprised of the following steps (a) to (c).

A desired film of a metal or metal compound has been formed on a semiconductor substrate placed in a reaction chamber of the CVD apparatus by a CVD process through a reducing decomposition reaction of a source gas. The source gas is a metal halide gas containing a metal element of the desired film. An undesired film of a same metal or metal compound as the desired film has been formed on an inner exposed surface of the chamber in addition to the desired film formed on the substrate.

(a) The semiconductor substrate on which the desired film has been formed is taken out of the reaction chamber of the CVD apparatus.

(b) A cleaning gas having an etching action and a diluting gas are introduced into the reaction chamber of the CVD apparatus after the step (a), thereby removing the undesired film from the inner exposed surface of the reaction chamber by the etching action of the cleaning gas. The cleaning gas is a metal halide gas containing the metal element of the desired film. An etch residue is generated in the reaction chamber by etching the undesired film.

(c) The cleaning gas and the diluting gas introduced into the reaction chamber of the CVD apparatus are evacuated from the chamber together with the etch residue.

With the chamber cleaning method of a CVD apparatus according to the present invention, the undesired film of a same metal or metal compound film as that of the desired film, which has been formed on the inner exposed surface of the reaction chamber of the CVD apparatus in addition to the desired film, is removed by introducing the cleaning gas having the etching action and the diluting gas into the reaction chamber in the step (b) and by evacuating the cleaning gas, the diluting gas, and the etch residue from the reaction chamber in the step (c).

Also, the cleaning gas is a metal halide gas containing the same metal element of the desired film and therefore, no bad effect occurs even if the evacuated cleaning gas is slightly left in the reaction chamber after the step (c). This means that not only the process of replacing the cleaning gas with the source gas but also the dummy CVD process after cleaning are required.

Accordingly, the cleaning time is decreased and at the same time, the throughput of the CVD process is increased.

Moreover, a metal halide gas containing the metal element of the desired film, which has an etching action with respect to the undesired film, is used as the cleaning gas. Therefore, the reaction chamber of the CVD apparatus is able to be cleaned by the etching action of the cleaning gas without using plasma.

The use of no plasma means that no plasma generation system is needed for cleaning. As a result, the fabrication cost of a CVD apparatus is lowered.

Additionally, because the cleaning time is decreased, the cleaning process is able to be finished during the carrying or conveying time of the substrate for a next CVD process. In other words, the inside of the reaction chamber of the CVD apparatus is able to be cleaned at each time when a CVD process is performed in the reaction chamber. Therefore, the quality of the desired film formed on the semiconductor substrate is stable independent of the number of the performed CVD processes.

In a preferred embodiment of the chamber cleaning method according to the present invention, the metal halide for the source gas is a same as the metal halide gas for the cleaning gas. In this case, the advantages of the present invention are effectively brought out.

In another preferred embodiment of the chamber cleaning method according to the present invention, the desired film is a titanium (Ti)-containing film such as Ti and TiN. In this case, it is preferred that the metal halide for the source gas is one selected from the group consisting of titanium tetrachloride ($TiCl_4$), titanium tetralodide ($TiI_4$), titanium tetrafluoride ($TiF_4$), and titanium hexafluoride ($TiF_6$), and the metal halide for the cleaning gas is one selected from the same group.

In still another preferred embodiment of the chamber cleaning method according to the present invention, the desired film is a tungsten (W)-containing film such as W. In this case, it is preferred that the metal halide for the source gas is one selected from the group consisting of tungsten tetrachloride ($WCl_4$), tungsten tetraiodide ($WI_4$), tungsten tetrafluoride ($WF_4$), and tungsten hexafluoride ($WF_6$), and the metal halide for the cleaning gas is one selected from the same group.

As the diluting gas which is introduced into the reaction chamber of the CVD apparatus together with the cleaning gas, any gas may be used if it is capable of dilution of the cleaning gas. The diluting gas serves to widely diffuse the introduced cleaning gas over the whole reaction chamber of the CVD apparatus. The diluting gas serves to prevent the reaction chamber from being damaged also through dilution.

Preferably, an argon (Ar), nitrogen ($N_2$) or hydrogen ($H_2$) gas is used as the diluting gas.

The flow rate of the cleaning gas is properly determined according to the thickness of the undesired film to be removed. It is preferred that the flow rate of the gaseous metal halide is set as 2 to 50 sccm. It is more preferred that the flow rate of the gaseous metal halide is set as 5 to 10 sccm.

The flow rate of the diluting gas is properly determined according to the kind of the cleaning gas. It is preferred that the flow rate of the diluting gas is set as approximately 10 to 100 times as much as that of the cleaning gas. It is more preferred that the flow rate of the diluting gas is set as approximately 50 times as much as that of the gaseous metal halide.

The reason for the preferred flow rates of the cleaning gas and the diluting gas is as follows.

If the amount of the cleaning gas is excessively large, there is a possibility that the reaction chamber of the CVD apparatus is etched or damaged. If the amount of the cleaning gas is excessively small, the etching action with respect to the undesired film becomes weak and consequently, the wanted cleaning effect is not given.

If the amount of the diluting gas is excessively large, the etching action of the cleaning gas with respect to the undesired film becomes weak and consequently, the wanted cleaning effect is not given. If the amount of the diluting gas is excessively small, the cleaning gas tends to be insufficiently diffused into the reaction chamber of the CVD apparatus.

It is preferred that the pressure in the reaction chamber during the step (b) is 5 to 20 Torr. It is more preferred that the pressure in the chamber during the step (b) is approximately 10 Torr. If the pressure in the reaction chamber is excessively low, the etching action of the cleaning gas with respect to the undesired film becomes weak and consequently, the wanted cleaning effect is not given. If the pressure in the reaction chamber is excessively high, the cleaning gas tends to be insufficiently diffused into the reaction chamber of the CVD apparatus.

The temperature in the reaction chamber during the step (b) is set as any value if the introduced cleaning gas is not thermally decomposed. For example, the step (b) may be performed while the inside of the reaction chamber is naturally cooled down from the temperature of the CVD process for forming the desired film.

The residing time of the cleaning gas and the diluting gas which have been introduced into the reaction chamber is optionally set so that the undesired film is entirely removed.

In the step (c), the inside of the reaction chamber is preferably evacuated until the pressure in the reaction chamber reaches a specific high vacuum level, preferably $10^{-4}$ Torr. This is to make sure that not only the cleaning and diluting gases but also the etch residue generated during the cleaning step (b) are removed from the reaction chamber.

It is needless to say that the steps (b) and (c) may be carried out at each time when the CVD process for forming the desired film is performed once or repeated twice or more. However, it is preferred that the steps (b) and (c) are carried out at every time when the CVD process for forming the desired film is finished. This is because the throughput becomes the maximum.

The chamber cleaning method according to the present invention may be applied to any CVD process if a metal or metal compound film is formed on the semiconductor substrate in any CVD process through reducing decomposition of a metal halide gas. For example, this method is applied to a thermal CVD, plasma-enhanced CVD, and photo CVD processes.

The CVD apparatus may have any structure such as parallel-plate, lateral, vertical, rotating, radial-flowing, or single-wafer type. It is needless to say that the CVD apparatus may be optionally designed so that the desired film of a metal or metal compound is formed to cover a semiconductor substrate with a special geometry.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

First Embodiment

Figure 3A:
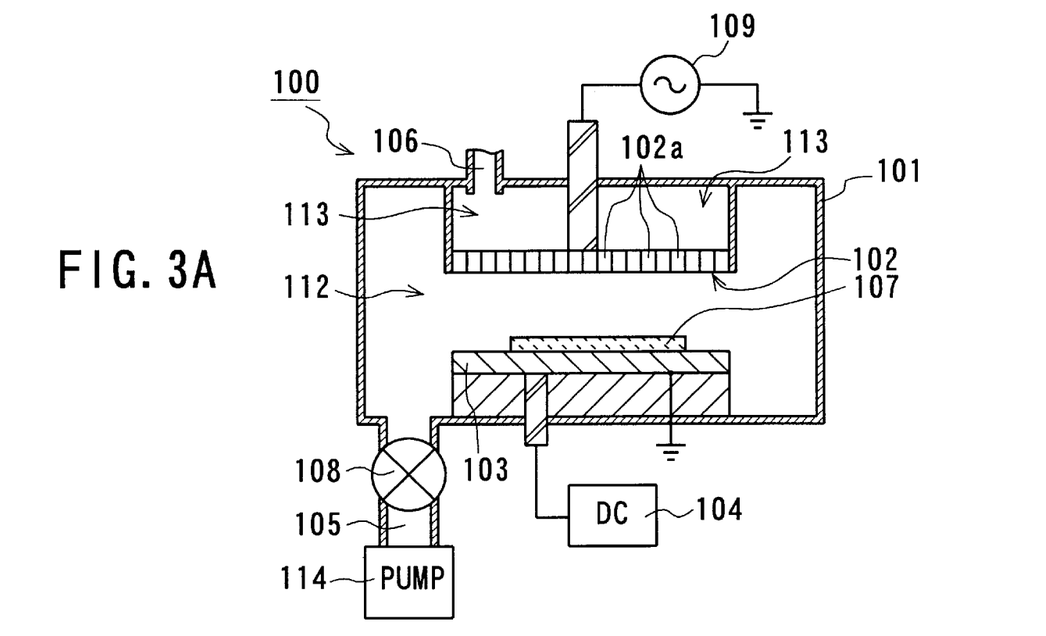
FIGS. 3A to 3D are schematic cross-sectional views of a plasma-enhanced CVD apparatus, respectively, in which a chamber cleaning method according to a first embodiment of the present invention is conducted after a plasma-enhanced CVD process for forming a metal or metal compound film on a semiconductor substrate.

FIG. 3A shows a plasma-enhanced CVD apparatus 100a in which a chamber cleaning method according to a first embodiment of the present invention is carried out.

This plasma-enhanced CVD apparatus 100 has a reaction chamber 101, an upper electrode 102 fixed onto the inner top wall of the chamber 101, a susceptor or substrate holder 103 fixed onto the inner bottom wall of the chamber 101, a radio-frequency (RF) power supply 109 provided outside the chamber 101, a direct-current (DC) power supply 104 provided outside the chamber 101, and a vacuum pump system 114 provided outside the chamber 101.

The reaction chamber 101 has a cylindrical shape whose diameter is 600 mm. The sidewall of the chamber 101 may be heated up to 200° C. by a heater (not shown) provided outside to surround the chamber 101.

The upper electrode 102, which is electrically connected to the RF power supply 109, has an inner space 113 and emission holes 112a. A specific RF power is supplied to the upper electrode 102 on operation to make plasma. The inner space 113 communicates with gas sources (not shown) provided outside the chamber 101 through a gas inlet 106 of the reaction chamber 101. The emission holes 102a communicates with a reaction space 112 of the chamber 101. The supplied gasses to the inner space 113 of the electrode 102 are mixed in the space 113 and then, emitted through the emission holes 102a to the reaction space 112.

The inside of the reaction chamber 101 (i.e., the reaction space 112) communicates with the vacuum pump system 114 through a gas outlet 105 of the chamber 101. A pressure-regulating valve 108 is provided at the gas outlet 105. The gas or gases existing in the reaction space 112 is/are evacuated by the vacuum pump system 114 to generate a vacuum atmosphere in the space 112. The pressure in the space 112 may be adjusted by the pressure-regulating valve 108.

The susceptor 103 is electrically connected to the DC power supply 104. A specific DC voltage in the range of 0 to 500 V is applied to the susceptor 103 and the substrate 107 placed thereon on operation, thereby heating the substrate 107 up to approximately 650° C.

When a Ti film is formed on a semiconductor wafer or substrate 107 on which a lot of semiconductor devices have been fabricated through the popular fabrication processes such as photolithography, dry etching, and film deposition, first, the wafer 107 is transported into the reaction chamber 101 of the CVD apparatus 100a and placed on the susceptor 103. The reaction space 112 of the chamber 101 has been held in a specific vacuum atmosphere. The state at this stage is shown in FIG. 3A.

Figure 3B:
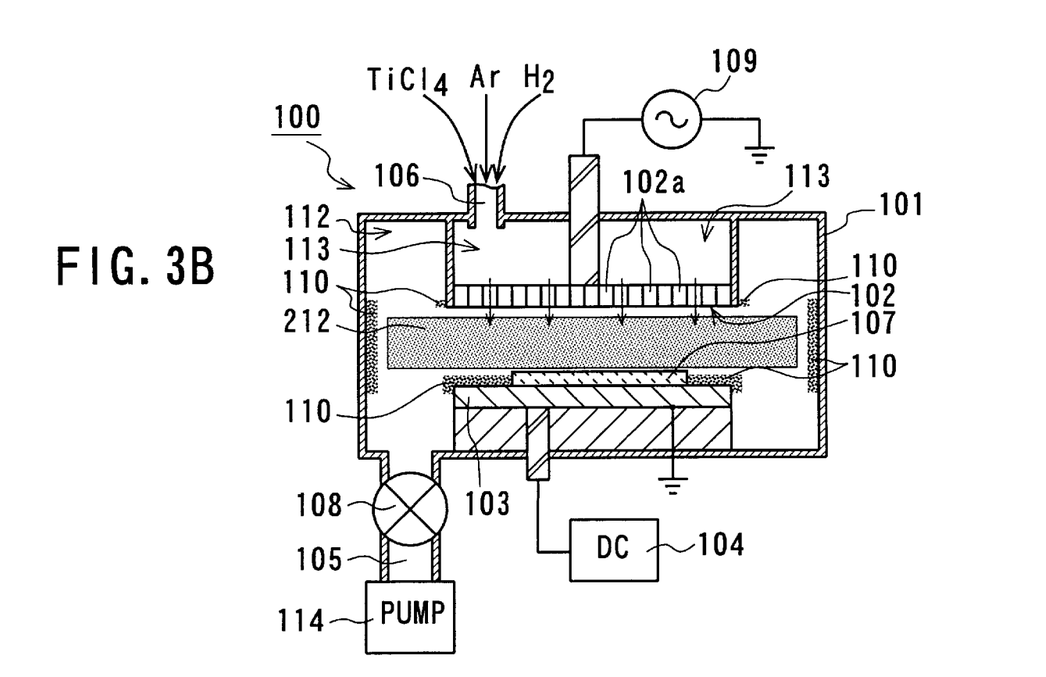

Next, a Ti film (not shown) with a thickness of approximately 10 to 30 nm is formed on the substrate 107 by a popular plasma-enhanced CVD process under the following condition in the manner shown in FIG. 3B.

Specifically, titanium tetrachloride ($TiCl_4$), argon (Ar), and hydrogen ($H_2$) gasses are supplied to the inner space 113 of the upper electrode 102 and mixed therein. The $TiCl_4$ gas is a source gas for the Ti film. The flow rates of the $TiCl_4$, Ar, and $H_2$ gasses are set as 3 to 10 sccm, 200 to 500 sccm, and 1000 to 2000 sccm, respectively. The mixture of $TiCl_4$, Ar, and $H_2$ gases thus produced is then emitted toward the substrate 107 through the emission holes 102a of the upper electrode 102. Thus, the mixture of $TiCl_4$, Ar, and $H_2$ gases are introduced into the reaction space 102 of the chamber 101. The pressure of the reaction space 102 is held at 3 to 10 Torr.

A specific DC bias voltage is applied to the substrate 107 by the DC power supply 104, thereby heating the temperature of the substrate 107 up to 500 to 600° C. At the same time, a specific RF power of several hundreds watts is applied to the upper electrode 102 by the RF power supply 109, thereby making a plasma 212 in the reaction space 102 of the chamber 101. The plasma 211 exists locally between the substrate 107 and the upper electrode 102.

During the above CVD process, undesired Ti films 110 tend to be deposited on the inner exposed surfaces of the vacuum chamber 101, the upper electrode 102, and the susceptor 103, together with the desired Ti film (not shown) deposited on the semiconductor substrate 107, as shown in FIG. 3B.

The substrate 107 on which the desired Ti film with the desired thickness has been formed is then taken out of the reaction chamber 101 without changing the vacuum condition in the reaction space 112 of the reaction chamber 101.

Figure 3C:
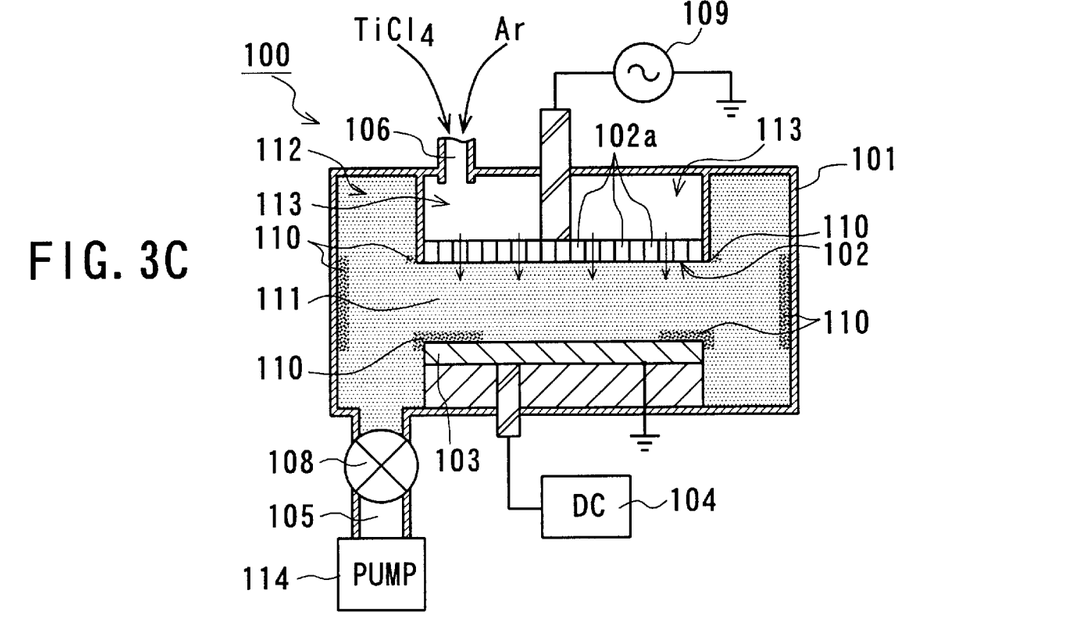

Subsequently, as shown in FIG. 3C, $TiCl_4$ and Ar gases are supplied to the gas mixing space 113 of the upper electrode 102 and mixed therein. $TiCl_4$ gas serves as a cleaning gas and Ar gas serves as a diluting gas for $TiCl_4$ gas. The flow rates of the $TiCl_4$ and Ar gasses are set as 10 sccm and 500 sccm, respectively.

The mixture of $TiCl_4$ and Ar gases thus produced is then emitted toward the susceptor 103 through the emission holes 102a of the upper electrode 102. Thus, the mixture of $TiCl_4$ and Ar gases are introduced into the reaction space 102 of the reaction chamber 101. The pressure of the reaction space 102 is adjusted as approximately 30 Torr by using the pressure-regulating valve 108. This state is held for 30 seconds to remove the undesired Ti films 110 in the chamber 101. The undesired Ti films 110 are removed by the etching action of the $TiCl_4$ gas. Since the $TiCl_4$ gas is sufficiently diluted by the Ar gas, the $TiCl_4$ gas is widely diffused within the whole reaction space 112. The state at this stage is shown in FIG. 3C.

During this etching step, the undesired Ti films 110 are removed and at the same time, some etch residue is generated in the reaction space 112 of the chamber 101 due to the etching action of the $TiCl_4$ gas.

Following this etching step, the inside of the chamber 101 is pumped out by the vacuum pump system 114 up to a vacuum level of $1.0 \times 10^{-4}$ Torr while the pressure-regulating valve 108 is fully opened. Thus, the mixture of $TiCl_4$ and Ar gases existing in the chamber 101 are completely evacuated from the chamber 101 and at the same time, the etch residue that have been generated in the reaction space 112 are removed from the chamber 101. The state at this stage is shown in FIG. 3D.

Thereafter, a next plasma-enhanced CVD process is carried out in the reaction chamber 101 after a next semiconductor substrate is transported into the chamber 101 and placed on the susceptor 103.

Figure 3D:
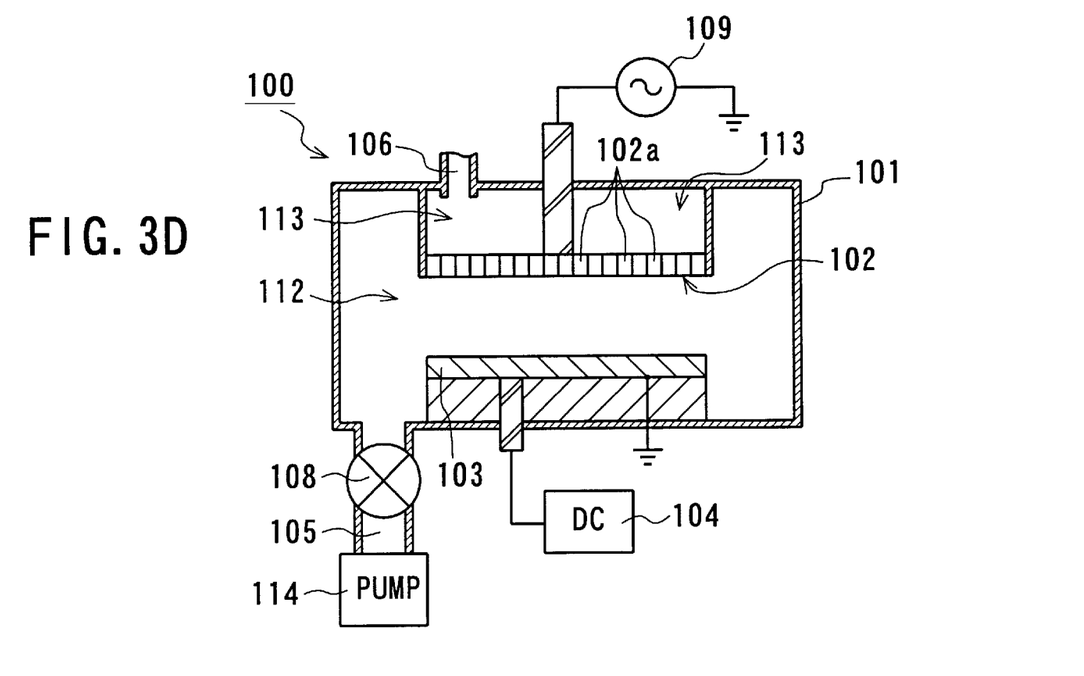

If necessary, the etching and evacuation steps of FIGS. 3C and 3D are repeated twice or more.

The inventor's test showed that the etch rate of the $TiCl_4$ gas was approximately 500 Å/minute in this case in spite of using no plasma, which implemented an efficient etching process for Ti films.

With the chamber cleaning method of a CVD apparatus according to the first embodiment of the present invention, the undesired Ti films 110, which have been formed on the inner exposed surfaces of the reaction chamber 110 of the plasma-enhanced CVD apparatus 100 in addition to the desired Ti film deposited on the semiconductor substrate 107, is removed by (i) introducing the cleaning gas ($TiCl_4$) having the etching action and the diluting gas (Ar) into the reaction chamber 101 and by (ii) evacuating the cleaning gas, the diluting gas, and the etch residue from the reaction chamber 101.

Also, the cleaning gas ($TiCl_4$) is one of the metal halide gases containing the same metal element Ti of the desired Ti film and therefore, no bad effect occurs even if the evacuated cleaning gas ($TiCl_4$) is slightly left in the reaction chamber 101 after the evacuation step. This means that not only the process of replacing the cleaning gas with the source gas but also the dummy CVD process after cleaning (i.e., recovery process or times) are required Accordingly, the cleaning time is decreased and at the same time, the throughput of the CVD process is increased.

Moreover, $TiCl_4$ gas containing Ti element of the desired Ti film, which has an etching action with respect to the undesired Ti films 110, is used as the cleaning gas. Therefore, the reaction chamber 101 of the CVD apparatus 100 is able to be cleaned by the etching action of the cleaning gas ($TiCl_4$) without using plasma.

Additionally, because the cleaning time is decreased, the cleaning process is able to be finished during the carrying or conveying time of the substrate 107 for a next CVD process. In other words, the inside of the reaction chamber 102 of the plasma-enhanced CVD apparatus 100 is able to be cleaned at each time when a CVD process is performed in the reaction chamber 102. Therefore, the quality of the desired Ti film formed on the semiconductor substrate 107 is stable independent of the number of the performed CVD processes.

Although $TiCl_4$ gas is used as the cleaning gas in the first embodiment, any other titanium halide gas such as $TiI_4$, $TiF_4$, and $TiF_6$ may be used. Although Ar gas is used as the diluting gas in the first embodiment, any other gas such as $N_2$ and $H_2$ may be used.

Figure 4:
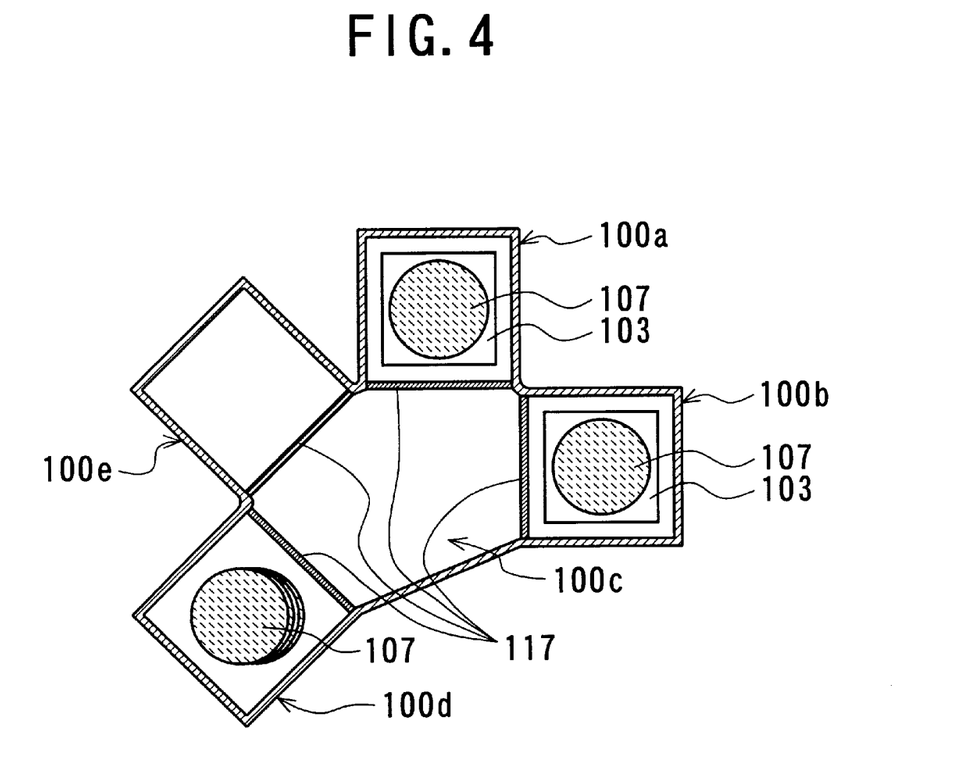
FIG. 4 is a schematic plan view of a plasma-enhanced CVD system, which includes the plasma-enhanced CVD apparatus shown in FIGS. 3A to 3D.

FIG. 4 shows a plasma-enhanced CVD system, which includes first and second reaction chambers 100a and 100b, a transport chamber 100c, a cassette chamber 100d, and a cooling chamber 100e. Each of the first and second reaction chambers 101a and 101b has the same configuration as that of the plasma-enhanced CVD apparatus 100 shown in FIG. 3A. The cassette chamber 100d is used for temporarily storing cassettes (not shown) on which the semiconductor substrates 107 are placed. The cooling chamber 100e is used for cooling the substrate 107 that have been subjected to a CVD process in the first or second reaction chamber 100a or 100b. The transport chamber 100c is used as a path through which the substrate 107 is transported among the first and second reaction chambers 100a and 100b, the cassette chamber 100d, and the cooling chamber 100e.

Not only the first and second reaction chambers 100a and 100b but also the transport, cassette, and cooling chambers 100c, 100d, and 100e are held in the same vacuum atmosphere. The reference numeral 117 denote gates of the first and second reaction chambers 101a and 101b, the cassette chamber 100d, and the cooling chamber 100e, respectively, through which the substrate 107 is transported.

For example, first, a first metal film is formed on the semiconductor substrate 107 in the first reaction chamber 100a. Next, after the pressure in the first chamber 100a is adjusted to accord with the pressure in the transport chamber 101c, the gate 117 of the first reaction chamber 100a is opened. The substrate 107 in the first reaction chamber 100a is moved to the transport chamber 100c and then, the gate of the first reaction chamber 100a is closed. Thereafter, the chamber cleaning method according to the first embodiment is started in the first reaction chamber 100a.

Following this, to form a second metal film on the substrate 107 on which the first metal film is formed, the gate 117 of the second reaction chamber 100b is opened and the substrate 107 is moved into the second reaction chamber 100b. After the gate 117 of the second reaction chamber 100b is closed, the second metal film is formed on the substrate 107.

At this stage, another semiconductor substrate 107 is moved into the transport chamber 100c and then, this new substrate 107 is transported into the first reaction chamber 100a for forming the first metal film. Because the cleaning of the first reaction chamber 100a is completed at this stage, this CVD process can be started at once without waiting the finish of chamber cleaning.

The substrate 107 that has been subjected to at least one of the CVD processes for the first and second metal films may be optionally moved into the cooling chamber 100e, thereby cooling the heated substrate 107 down to a specific temperature.

As described above, by using the chamber cleaning method according to the first embodiment, the reaction chamber 101 of the plasma-enhanced CVD apparatus 100 is able to be completely cleaned in the transporting or moving time of the substrate 107.

Second Embodiment

Figure 5A:
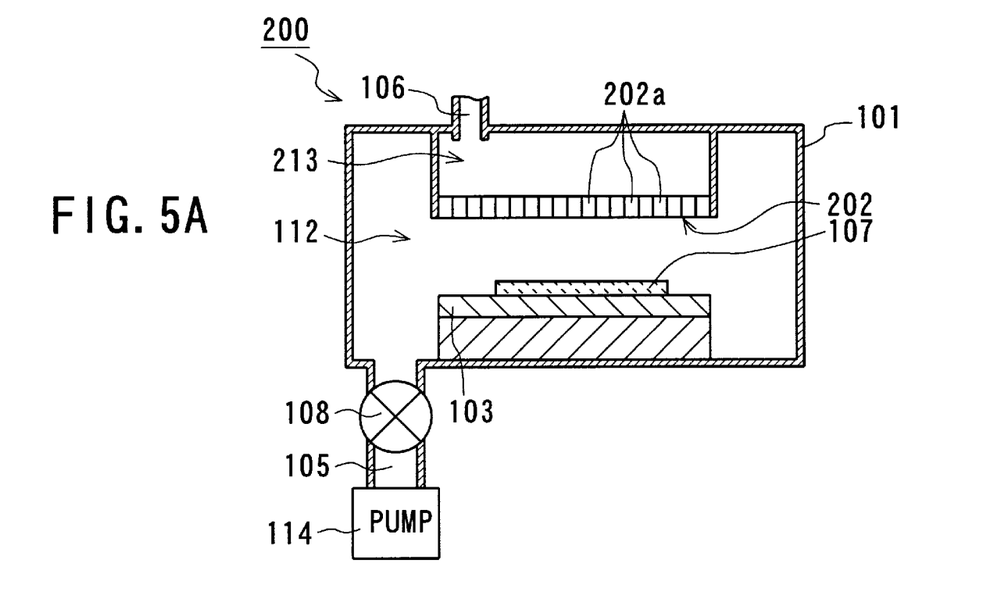
FIGS. 5A to 5D are schematic cross-sectional views of a thermal CVD apparatus, respectively, in which a chamber cleaning method according to a second embodiment of the present invention is conducted after a thermal CVD process for forming a metal or metal compound film on a semiconductor substrate.

FIG. 5A shows a thermal CVD apparatus 200 in which a chamber cleaning method according to a second embodiment of the present invention is carried out.

This thermal CVD apparatus 200 has a same configuration as that of the plasma-enhanced CVD apparatus 100 shown in FIG. 3A, except that the power supplies 104 and 109 in the apparatus 100 are canceled and that a gas mixing/emission member 202 is provided in the reaction chamber 101 instead of the upper electrode 102 in the apparatus 100.

The gas mixing/emission member 202 is fixed onto the inner top wall of the reaction chamber 101. This member 202 has a gas mixing space 213 and gas emission holes 202a. The gas mixing space 213 is substantially the same as the inner space 113 in the apparatus 100. The gas emission holes 202a are substantially the same as the gas emission holes 102a in the apparatus 100.

When a TiN film is formed on the semiconductor substrate 107 on which a lot of semiconductor devices have been fabricated, first, the substrate 107 is transported into the reaction chamber 101 of the thermal CVD apparatus 200 and placed on the susceptor 103. The reaction space 112 of the chamber 101 has been held in specific vacuum atmosphere. The state at this stage is shown in FIG. 5A.

The reason why the TiN film is deposited by a thermal CVD process (not a plasma-enhanced CVD process) is that a thermal CVD process is more effective in practical fabrication process of semiconductor devices.

Figure 5B:
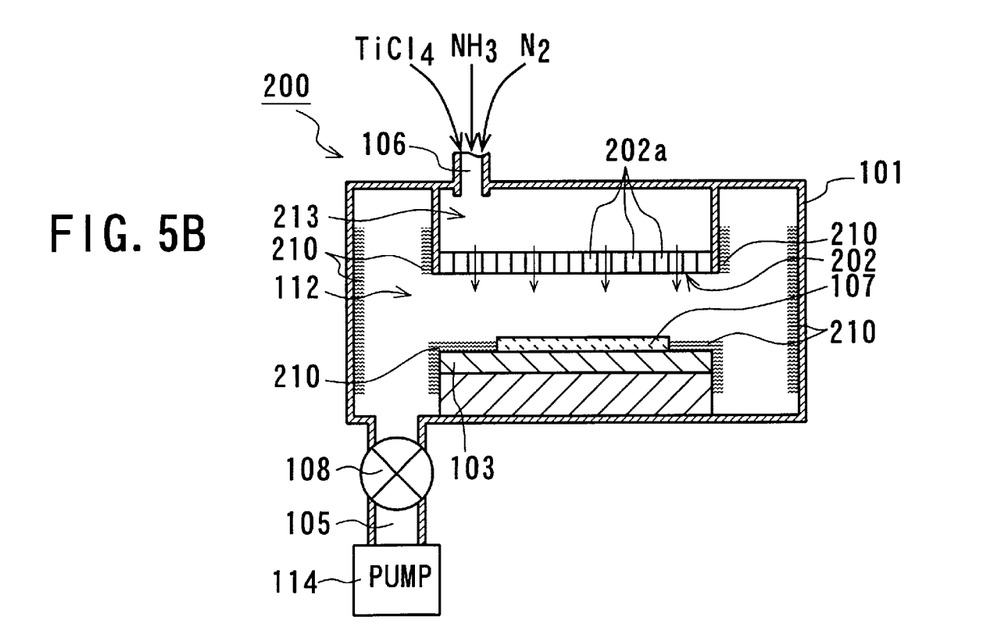

Next, a TiN film (not shown) with a thickness of approximately 0.05 to 0.3 $\mu$m is formed on the substrate 107 by a popular thermal CVD process under the following condition, as shown in FIG. 5B.

Specifically, Titanium tetrachloride ($TiCl_4$), ammonia ($NH_3$), and nitrogen ($N_2$) gasses are supplied to the gas mixing space 213 of the gas mixing/emission member 202 and mixed therein. The flow rates of the $TiCl_4$, $NH_3$, and $N_2$ gasses are set as 30 to 50 sccm, 40 to 70 sccm, and 30 to 50 sccm, respectively. The mixture of $TiCl_4$, $NH_3$, and $N_2$ gases thus produced is then emitted toward the substrate 107 through the emission holes 202a of the member 202. Thus, the mixture of $TiCl_4$, $NH_3$, and $N_2$ gases are introduced into the reaction space 102 of the chamber 101. The pressure of the reaction space 102 is held at 15 to 30 Torr. The substrate 107 is heated up to 500 to 650° C. by a heater (not shown) provided in the susceptor 103. Unlike the cleaning method according to the first embodiment, no plasma is generated in the reaction space 102.

During the thermal CVD process, undesired TiN films 210 tend to be deposited on the inner exposed surfaces of the vacuum chamber 101, the gas mixing/emission member 202, and the susceptor 103, together with the desired TiN film (not shown) deposited on the semiconductor substrate 107, as shown in FIG. 5B.

The thickness of the desired TiN film on the substrate 107 is typically larger than the desired Ti film in the first embodiment while no plasma is used. Therefore, the undesired TiN films 210 are distributed in the wider areas than the undesired Ti films 110 in the first embodiment.

The substrate 107 on which the desired TiN film with the desired thickness has been formed is then taken out of the reaction chamber 101 without changing the vacuum condition in the reaction space 112 of the reaction chamber 101.

Figure 5C:
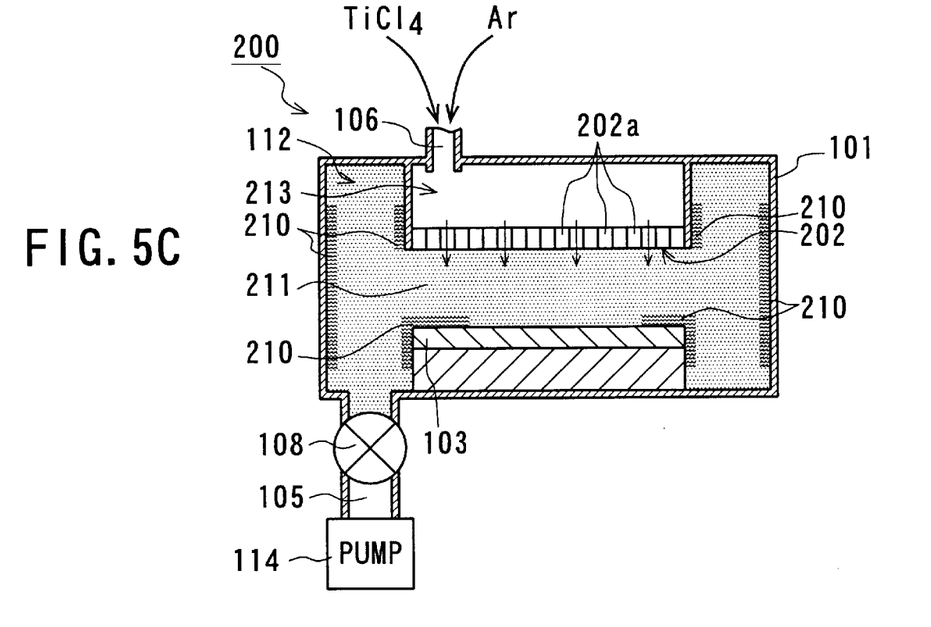

Subsequently, as shown in FIG. 5C, $TiCl_4$ and Ar gasses are supplied to the gas mixing space 213 of the gas mixing/emission member 202 and mixed therein. The flow rates of the $TiCl_4$ and Ar gasses are set as 10 sccm and 500 sccm, respectively.

The gaseous mixture of $TiCl_4$ and Ar thus produced is then emitted toward the susceptor 103 through the emission holes 202a of the member 202. Thus, the gaseous mixture of $TiCl_4$ and Ar are introduced into the reaction space 102 of the reaction chamber 101 of the thermal CVD apparatus 200. The pressure of the reaction space 102 is adjusted to be approximately 1 to 10 Torr by using the pressure-regulating valve 108. This state is held for one minute to remove the undesired TiN films 210 in the chamber 101. The undesired TiN films 210 are removed by the etching action of the $TiCl_4$ gas. Since the $TiCl_4$ gas is sufficiently diluted by the Ar gas, the $TiCl_4$ gas is widely diffused within the whole reaction space 112. The state at this stage is shown in FIG. 5C.

During this etching step, the undesired TiN films 210 are removed and at the same time, some etch residue is generated in the reaction space 112 of the chamber 101 due to the etching action of the $TiCl_4$ gas.

Following this etching step, the inside of the chamber 101 is pumped out by the vacuum pump 114 up to a vacuum level of $1.0 \times 10^{-5}$ Torr while the valve 108 is fully opened. Thus, the gaseous mixture of $TiCl_4$ and Ar are completely evacuated from the chamber 101 and at the same time, the etch residue that has been generated in the chamber 101 by the etching action of the $TiCl_4$ gas is removed from the chamber 101. The state at this stage is shown in FIG. 5D.

Thereafter, a next thermal CVD process is carried out in the reaction chamber 101 after a next semiconductor substrate is transported into the chamber 101 and placed on the susceptor 103.

Figure 5D:
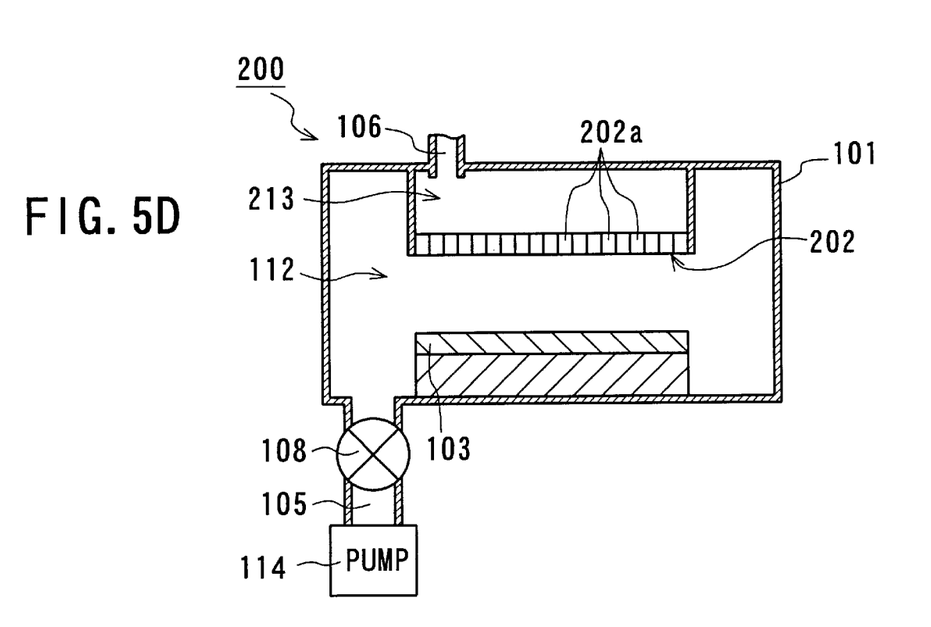

If necessary, the etching and evacuation steps of FIGS. 5C and 5D are repeated twice or more.

With the chamber cleaning method of a CVD apparatus according to the second embodiment of the present invention, the undesired TiN films 210, which have been formed on the inner exposed surfaces of the reaction chamber 110 of the thermal CVD apparatus 200 in addition to the desired TiN film deposited on the semiconductor substrate 107, are removed by (i) introducing the cleaning gas ($TiCl_4$) having the etching action and the diluting gas (Ar) into the reaction chamber 101 and by (ii) evacuating the cleaning gas, the diluting gas, and the etch residue from the reaction chamber 101.

Also, the cleaning gas ($TiCl_4$) is one of the metal halide gases containing the same metal element Ti of the desired TiN film and therefore, no bad effect occurs even if the evacuated cleaning gas ($TiCl_4$) is slightly left in the reaction chamber 101 after the evacuation step. This means that not only the process of replacing the cleaning gas with the source gas but also the dummy CVD process after cleaning (i.e., recovery process or times) are required.

Accordingly, like the first embodiment, the cleaning time is decreased and at the same time, the throughput of the CVD process is increased.

Moreover, $TiCl_4$ gas containing Ti element of the desired TiN film, which has an etching action with respect to the undesired TiN films 210, is used as the cleaning gas. Therefore, the reaction chamber 101 of the CVD apparatus 200 is able to be cleaned by the etching action of the cleaning gas ($TiCl_4$) without using plasma.

Additionally, because the cleaning time is decreased, the cleaning process is able to be finished during the carrying or conveying time of the substrate 107 for a next CVD process. In other words, the inside of the reaction chamber 102 of the thermal CVD apparatus 200 is able to be cleaned at each time when a CVD process is performed in the reaction chamber 102. Therefore, the quality of the desired TiN film formed on the semiconductor substrate 107 is stable independent of the number of the performed CVD processes.

Although $TiCl_4$ gas is used as the cleaning gas in the second embodiment, any other titanium halide gas such as $TiI_4$, $TiF_4$, and $TiF_6$ may be used. Although Ar gas is used as the diluting gas in the second embodiment, any other gas such as $N_2$ and $H_2$ may be used.

The use of no plasma means that no plasma generation system is needed for cleaning in the thermal CVD apparatus 200. As a result, there is an additional advantage that the fabrication cost of the CVD apparatus 200 is lowered.

Third Embodiment

In a third embodiment, a tungsten (W) film is formed on the semiconductor substrate 107 on which a lot of semiconductor devices have been fabricated using the thermal CVD apparatus 200 used in the second embodiment of the present invention.

The W film is often used to fill deep contact holes or deep through holes of a thick dielectric film. The W film is usually formed through the nucleation step and the filling step.

First, the substrate 107 is transported into the reaction chamber 101 of the thermal CVD apparatus 200 and placed on the susceptor 103. The reaction space 112 of the chamber 101 has been held in vacuum.

Next, a nucleation W subfilm (not shown) with a specific thickness is formed on a dielectric film (not shown) located on or over the substrate 107 by a popular thermal CVD process under the following condition. The dielectric film has deep contact holes.

Figure 6A:
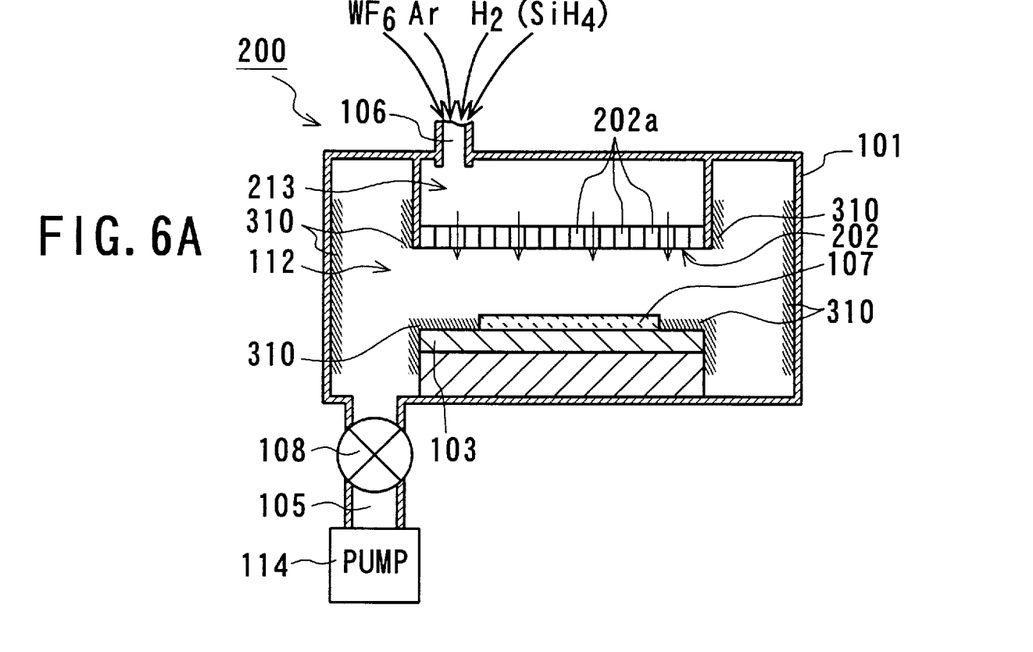
FIGS. 6A and 6B are schematic cross-sectional views of a thermal CVD apparatus, respectively, in which a chamber cleaning method according to a third embodiment of the present invention is conducted after a thermal CVD process for forming a metal or metal compound film on a semiconductor substrate.

Specifically, as shown in FIG. 6A, Monosilan ($SiH_4$), tungsten hexafluoride ($WF_6$), argon (Ar), and hydrogen ($H_2$) gasses are supplied to the gas mixing space 213 of the gas mixing/emission member 202 and mixed therein. The flow rates of the $SiH_4$, $WF_6$, Ar, and $H_2$ gasses are set as 10 sccm, 20 sccm, 800 sccm, and 1000 sccm, respectively. The gaseous mixture of $SiH_4$, $WF_6$, Ar, and $H_2$ thus produced is then emitted toward the substrate 107 through the emission holes 202a of the member 202. Thus, the gaseous mixture of $SiH_4$, $WF_6$, Ar, and $H_2$ are introduced into the reaction space 102 of the chamber 101. The pressure of the reaction space 102 of the chamber 101 is held at 30 Torr. The substrate 107 is heated up to 450° C. Like the second embodiment, no plasma is generated in the reaction space 102. This nucleation step is performed for approximately 10 seconds.

Subsequently, a filling W subfilm (not shown) with a specific thickness is formed on the nucleation W subfilm thus deposited on the dielectric film by a similar thermal CVD process to the nucleation step under the following condition.

$WF_6$, Ar, and $H_2$ gasses are supplied to the gas mixing space 213 of the gas mixing/emission member 202 and mixed therein. The flow rates of the $WF_6$, Ar, and $H_2$ gasses are set as 95 sccm, 600 sccm, and 1000 sccm, respectively. The gaseous mixture of $WF_6$, Ar, and $H_2$ thus produced is then emitted toward the substrate 107 through the emission holes 202a of the member 202.

Thus, the gaseous mixture of $WF_6$, Ar, and $H_2$ are introduced into the reaction space 102 of the chamber 101.

The pressure of the reaction space 102 is held at 90 Torr and the temperature of the substrate 107 is held at 450° C. No plasma is generated in the reaction space 102. This filling step is performed for approximately 50 seconds so as to completely fill the contact holes with the W film.

Thus, the total thickness of the resultant W film, which consists of the nucleation and filling W subfilms, becomes approximately 5000 Å.

In the nucleation step for the nucleation W subfilm, as seen from the above explanation, $SiH_4$ is additionally supplied to suppress the consumption of silicon of the substrate 107 due to $WF_6$, and the flow rate of $WF_6$ is set to be lower than the filing step for the filling W subfilm.

During the above CVD processes, undesired W films 310 tend to be deposited on the inner exposed surfaces of the vacuum chamber 101, the gas mixing/emission member 202, and the susceptor 103, together with the desired W film (not shown) deposited on the semiconductor substrate 107, as shown in FIG. 6A. Since no plasma is used, the undesired W films 310 are distributed in wider areas than the undesired Ti films 110 in the first embodiment.

The substrate 107 on which the desired W film with the desired thickness has been formed is then taken out of the reaction chamber 101 without changing the vacuum condition in the reaction space 112 of the reaction chamber 101.

Figure 6B:
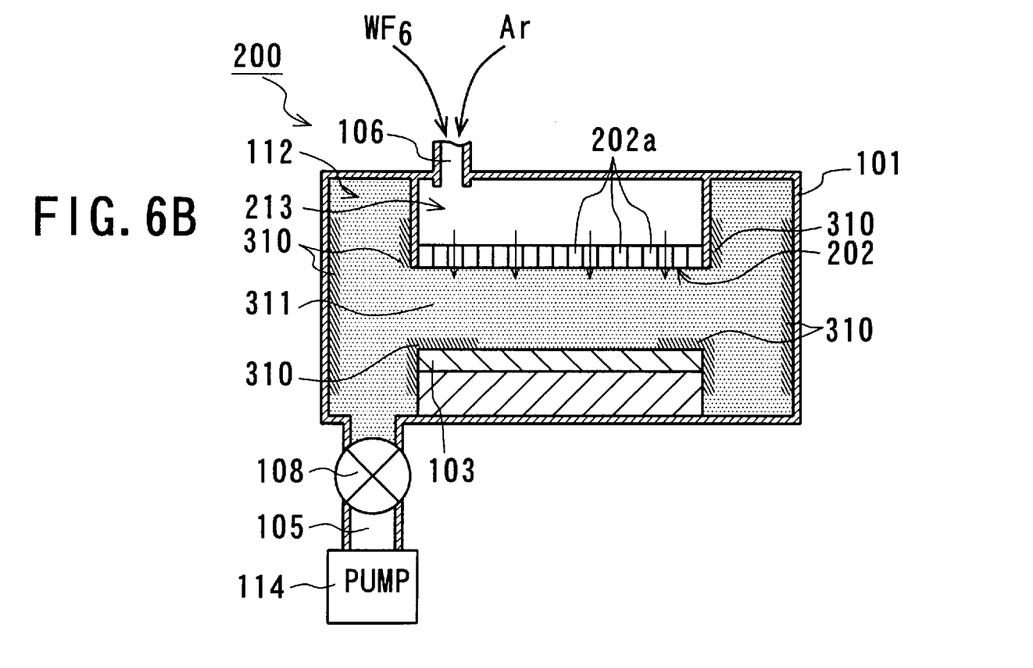

Subsequently, as shown in FIG. 6B, $WF_6$ and Ar gasses are supplied to the gas mixing space 213 of the gas mixing/emission member 202 and mixed therein. The flow rates of the $WF_6$ and Ar gasses are set as 100 sccm and 1000 sccm, respectively.

The gaseous mixture of $WF_6$ and Ar thus produced is then emitted toward the susceptor 103 through the emission holes 202a of the member 202. Thus, the gaseous mixture of $WF_6$ and Ar are introduced into the reaction space 102 of the chamber 101. The pressure of the reaction space 102 is adjusted to be approximately 10 Torr by using the pressure-regulating valve 108. To remove the undesired W films 310 in the chamber 101 by the etching action of the $WF_6$ gas, this state is held for 30 seconds. Since the $WF_6$ gas is sufficiently diluted by the Ar gas, the $WF_6$ gas is widely diffused within the whole reaction space 112. The state at this stage is shown in FIG. 6B.

During this etching step, the undesired W films 310 are removed and at the same time, some etch residue is generated in the reaction space 112 of the chamber 101 due to the etching action of the $WF_6$ gas.

Following this etching step, the inside of the chamber 101 is pumped out by the vacuum pump 114 up to a vacuum level of $1.0 \times 10^{-4}$ Torr while the valve 108 is fully opened. Thus, the gaseous mixture of $WF_6$ and Ar are completely evacuated from the chamber 101 and at the same time, the etch residue that has been generated by the etching action of the $WF_6$ gas is removed from the chamber 101.

Thereafter, a next thermal CVD process is carried out in the reaction chamber 101 after a next semiconductor substrate is transported into the chamber 101 and placed on the susceptor 103.

If necessary, the etching and evacuation steps of FIG. 6B is repeated twice or more.

The inventor's test showed that the etch rate of the $WF_6$ gas was approximately 600 Å/minute in this case.

With the chamber cleaning method of a CVD apparatus according to the third embodiment of the present invention, in the same way as the second embodiment, the undesired W films 310, which have been formed on the inner exposed surfaces of the reaction chamber 110 of the thermal CVD apparatus 200 in addition to the desired W film deposited on the semiconductor substrate 107, are removed by (i) introducing the cleaning gas ($WF_6$) having the etching action and the diluting gas (Ar) into the reaction chamber 101 and by (ii) evacuating the cleaning gas, the diluting gas, and the etch residue from the reaction chamber 101.

Also, the cleaning gas ($WF_6$) is one of the metal halide gases containing the same metal element W of the desired W film and therefore, no bad effect occurs even if the evacuated cleaning gas ($WF_6$) is slightly left in the reaction chamber 101 after the evacuation step. This means that not only the process of replacing the cleaning gas with the source gas but also the dummy CVD process after cleaning (i.e., recovery process or times) are required.

Accordingly, like the first and second embodiments, the cleaning time is decreased and at the same time, the throughput of the CVD process is increased.

Moreover, $WF_6$ gas containing W element of the desired W film, which has an etching action with respect to the undesired W films 310, is used as the cleaning gas. Therefore, the reaction chamber 101 of the CVD apparatus 200 is able to be cleaned by the etching action of the cleaning gas ($WF_6$) without using plasma.

Additionally, because the cleaning time is decreased, the cleaning process is able to be finished during the carrying or conveying time of the substrate 107 for a next CVD process. In other words, the inside of the reaction chamber 102 of the thermal CVD apparatus 200 is able to be cleaned at each time when a CVD process is performed in the reaction chamber 102. Therefore, the quality of the desired W film formed on the semiconductor substrate 107 is stable independent of the number of the performed CVD processes.

Although $WF_6$ gas is used as the cleaning gas in the third embodiment, any other tungsten halide gas such as $WCl_4$, $WI_4$, $WF_4$, and $WF_6$ may be used. Although Ar gas is used as the diluting gas in the third embodiment, any other gas such as $N_2$ and $H_2$ may be used.

The use of no plasma means that no plasma generation system is needed for cleaning in the thermal CVD apparatus 200. As a result, there is an additional advantage that the fabrication cost of the CVD apparatus 200 is lowered.

Although Ti, TiN, and W films are formed on or over the semiconductor substrate 107 in the first to third embodiments, the present invention is not limited to these metals. It is needless to say that the cleaning method of the present invention may be applied to any other metal if the cleaning gas is one of the metal halide gases containing the same metal element of the desired film and has an etching action with respect to the desired film.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A chamber cleaning method of a CVD apparatus, wherein a desired film of a metal or metal compound has been formed on a semiconductor substrate placed in a reaction chamber of said CVD apparatus by a CVD process through a reducing decomposition reaction of a source gas, said source gas being a metal halide gas containing a metal element of the desired film;

and wherein an undesired film of a same metal or metal compound as said desired film has been formed on an inner exposed surface of said chamber in addition to said desired film formed on said substrate;

said method comprising the steps of:

(a) taking said semiconductor substrate on which said desired film has been formed out of said reaction chamber of said CVD apparatus;

(b) introducing a cleaning gas having an etching action and a diluting gas into said reaction chamber of said CVD apparatus after the step (a), thereby removing said undesired film from said inner exposed surface of said reaction chamber by the etching action of said cleaning gas;

said cleaning gas being a metal halide gas containing said metal element of said desired film;

an etching product being generated in said reaction chamber by etching said undesired film; and (c) evacuating said cleaning gas and said diluting gas introduced into said reaction chamber of said CVD apparatus from said chamber together with said etching product.

2. The method as claimed in claim 1, wherein said metal halide for said source gas is a same as said metal halide gas for said cleaning gas.

3. The method as claimed in claim 1, wherein said desired film is a Ti-containing film;

and wherein said metal halide for said source gas is at least one selected from the group consisting of titanium tetrachloride ($TiCl_4$), titanium tetraiodide ($TiI_4$), titanium tetrafluoride ($TiF_4$), and titanium hexafluoride ($TiF_6$);

and wherein said metal halide for said cleaning gas is at least one selected from said group.

4. The method as claimed in claim 1, wherein said desired film is a W-containing film;

and wherein said metal halide for said source gas is at least one selected from the group consisting of tungsten tetrachloride ($WCl_4$), tungsten tetraiodide ($WI_4$), tungsten tetrafluoride ($WF_4$), and tungsten hexafluoride ($WF_6$);

and wherein said metal halide for said cleaning gas is at least one selected from said group.

5. The method as claimed in claim 1, wherein said steps (b) and (c) are repeated at least twice.

6. The method as claimed in claim 1, wherein said diluting gas is at least one selected from the group consisting of argon (Ar), nitrogen ($N_2$) and hydrogen ($H_2$) gases.

7. The method as claimed in claim 1, wherein the inside of said reaction chamber is evacuated until the pressure in said reaction chamber reaches a vacuum level of $10^{-4}$ Torr in said step (c).

8. The method as claimed in claim 1, wherein said CVD apparatus is a plasma-enhanced CVD apparatus.

9. The method as claimed in claim 1, wherein said CVD apparatus is a thermal CVD apparatus.

* * * * *